United States Patent
Nakamura et al.

(10) Patent No.: US 7,576,612 B2
(45) Date of Patent: Aug. 18, 2009

(54) POWER AMPLIFIER (75) Inventors: Shigeki Nakamura, Osaka (JP); Junji Ito, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/958,966

(22) Filed: Dec. 18, 2007

(65) Prior Publication Data
US 2008/0143445 A1  Jun. 19, 2008

(30) Foreign Application Priority Data
Dec. 18, 2006 (JP) ............................ 2006-340277

(51) Int. Cl.
*H03F 3/04* (2006.01)
(52) U.S. Cl. ..................................... 330/296
(58) Field of Classification Search ................. 330/296, 330/299, 285
See application file for complete search history.

(56) References Cited
U.S. PATENT DOCUMENTS

| | | | | |
|---|---|---|---|---|
| 6,114,912 | A  * | 9/2000 | Ashby et al. ................ | 330/296 |
| 6,388,529 | B2 * | 5/2002 | Morohashi et al. .......... | 330/296 |
| 6,392,492 | B1 * | 5/2002 | Yuan ........................... | 330/311 |
| 6,750,722 | B2 | 6/2004 | Newman et al. | |
| 2001/0054934 | A1 * | 12/2001 | Antognetti et al. .......... | 330/296 |
| 2004/0130392 | A1 | 7/2004 | Saito | |
| 2006/0109056 | A1 * | 5/2006 | Colbeck ...................... | 330/255 |

FOREIGN PATENT DOCUMENTS

JP   2004-153378   5/2004

* cited by examiner

*Primary Examiner*—Robert Pascal
*Assistant Examiner*—Khiem D Nguyen
(74) *Attorney, Agent, or Firm*—Hamre, Schumann, Mueller & Larson, P.C.

(57) ABSTRACT

The present invention provides a power amplifier that includes the following: an RF operation transistor 3 having a base to which an RF signals is inputted, an emitter connected to the ground, and a collector connected to a power supply and a terminal for outputting an RF signal; a current reference transistor 12 having a collector connected to a reference current source 11, an emitter connected to the ground, and a base connected to the base of the RF operation transistor, an operational amplifier 22 formed of CMOS having one input connected to the collector of the current reference transistor and the other input connected to the base of the RF operation transistor; and a voltage-to-current conversion transistor 22 for converting the output of the operational amplifier 22 into a current to be supplied to the base of the RF operation transistor. The power amplifier has low power consumption and an efficient use of chip area, and a current variation due to the relative variation in $h_{FE}$ can be prevented, so as to be driven with a low power supply voltage.

14 Claims, 8 Drawing Sheets

POWER AMPLIFIER

BACKGROUND OF THE INVENTION

1. Field of the Invention

The present invention relates to a power amplifier used mainly in various kinds of radio equipment, communication equipment, measuring devices, and the like.

2. Description of Related Art

Figure 1:
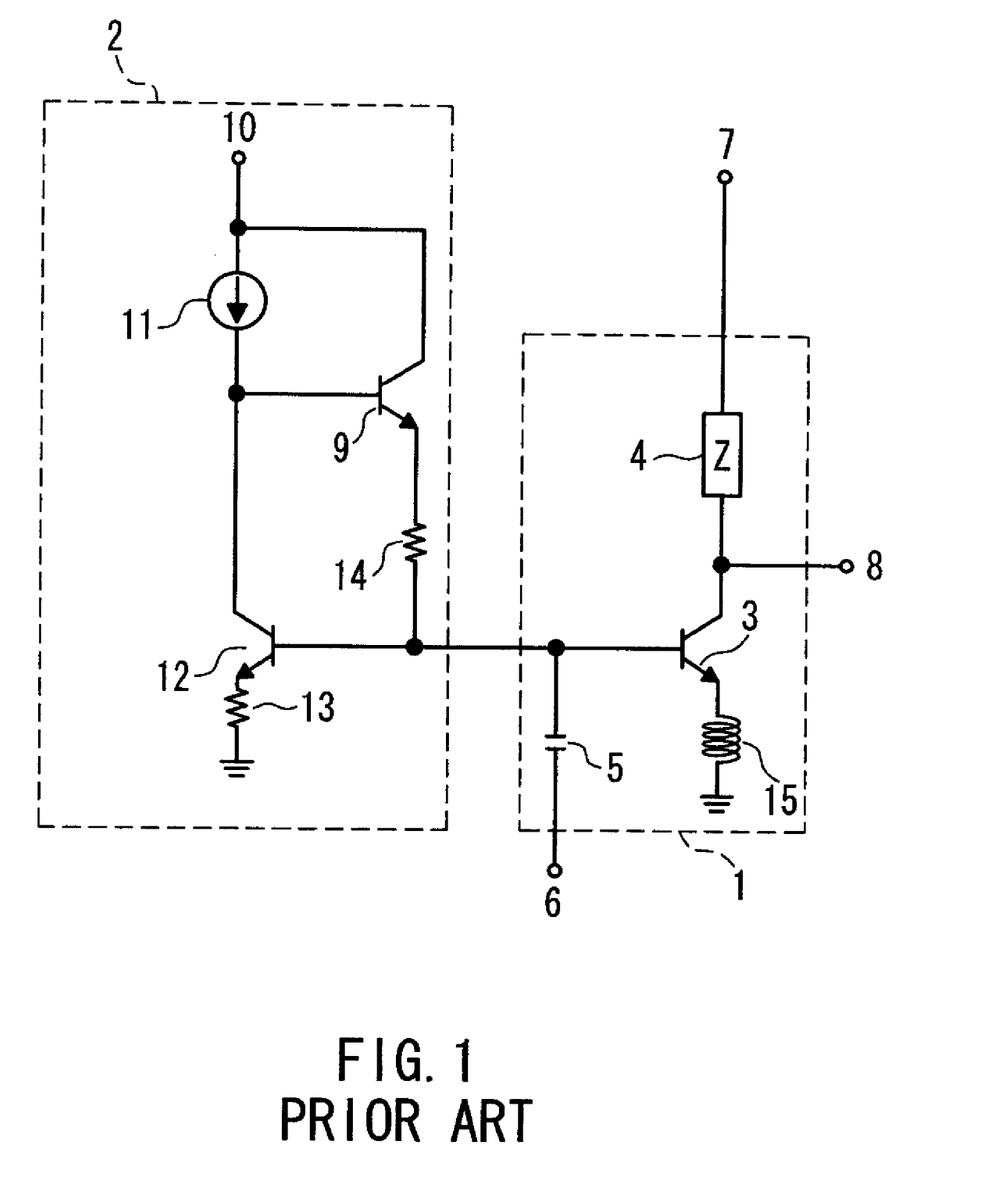
FIG. 1 is a circuit diagram of a conventional power amplifier.

FIG. 1 shows the circuit configuration of a conventional amplifier disclosed in, for example, JP 2004-153378. This amplifier includes an RF operation section 1 and a DC bias circuit 2.

The RF operation section 1 includes an RF operation transistor 3 for carrying out voltage-to-current conversion, an impedance 4, a DC blocking capacitor 5, and a feedback inductor 15. The emitter of the RF operation transistor 3 is grounded via the feedback inductor 15, and the base of the RF operation transistor 3 is connected via the DC blocking capacitor 5 to an RF signal input terminal 6 to which a high frequency signal is inputted. A voltage is supplied from a power supply 7 to the collector of the RF operation transistor 3 via the impedance 4. A high frequency signal output can be obtained from the collector of the RF operation transistor 3, and the collector is connected to an RF signal output terminal 8.

The DC bias circuit 2 includes a base current compensation transistor 9, a power supply 10, a reference current source 11, a current reference transistor 12, a feedback resistor 13, and an RF blocking resistor 14. The base of the RF operation transistor 3 is connected to the emitter of the base current compensation transistor 9 via the RF blocking resistor 14. Further, the base of the RF operation transistor 3 also is connected to the base of the current reference transistor 12. The RF operation transistor 3 forms a current mirror circuit together with the current reference transistor 12.

The emitter of the current reference transistor 12 is grounded via the feedback resistor 13. The collector of the current reference transistor 12 is connected to the power supply 10 via the reference current source 11.

The separate power supplies, i.e., the power supply 10 and the power supply 7, are illustrated in FIG. 1. However, the power supplies are not necessarily provided separately, and a single power supply may be used instead of using the power supply 10 and the power supply 7. Further, the feedback inductor 15 is not necessarily required, and the emitter of the RF operation transistor 3 may be grounded directly.

Hereinafter, an operation of the amplifier configured as described above will be described. The RF operation transistor 3 is biased by the current reference transistor 12 having a diode structure in which the base and the collector are short-circuited. The base current compensation transistor 9 is inserted so as to form a current mirror in order to prevent a current variation due to the absolute variation in DC current amplification factor ($h_{FE}$) between the RF operation transistor 3 and the current reference transistor 12. A backflow of a high frequency signal is prevented by the RF blocking resistor 14. The linearity of the amplifier can be enhanced by sufficiently increasing the resistance value of the feedback resistor 13.

However, in the above-described configuration, two stages of transistors of diode connection are configured in series. Hence, when a general SiGe process is considered, a power supply voltage of at least 1.6 V is needed since the voltage between the emitter and the base is about 0.8 V. This is inconvenient when a variation in power supply voltage and various kinds of dispersions are taken into consideration.

SUMMARY OF THE INVENTION

With the foregoing in mind, it is an object of the present invention to provide a small and low power-consuming amplifier that can be driven with a low power supply voltage, and in which deterioration in efficiency or linearity of the amplifier can be prevented.

In order to solve this problem, a power amplifier having a first configuration of the present invention includes the following: an RF operation transistor having a base to which an RF signal is inputted, an emitter connected to the ground, and a collector connected to a power supply and a terminal for outputting an RF signal; a current reference transistor having a collector connected to a reference current source, an emitter connected to the ground, and a base connected to the base of the RF operation transistor; an operational amplifier formed of CMOS having one input connected to the collector of the current reference transistor and the other input connected to the base of the RF operation transistor; and a voltage-to-current conversion transistor for converting the output of the operational amplifier into a current to be supplied to the base of the RF operation transistor.

A power amplifier having a second configuration of the present invention includes the following: an RF operation transistor having a base to which an RF signal is inputted, an emitter connected to the ground, and a collector connected to a power supply and a terminal for outputting an RF signal; a current reference transistor having a collector connected to a reference current source, an emitter connected to the ground, and a base connected to the collector thereof, an operational amplifier formed of CMOS having one input connected to the collector of the current reference transistor and the other input connected to the base of the RF operation transistor; and a voltage-to-current conversion transistor for converting the output of the operational amplifier into a current to be supplied to the current to the base of the RF operation transistor.

According to the present invention, a power amplifier is improved so that a current variation resulting from a variation in $h_{FE}$ is suppressed, so as to be driven with a low supply power voltage. Accordingly, a power amplifier consuming less power and requiring a smaller chip area can be obtained.

Further, according to the power amplifier having the second configuration, an inflow of an RF signal to the current reference transistor can be prevented.

DETAILED DESCRIPTION OF THE INVENTION

On the basis of the above configurations, the power amplifier of the present invention may have the following aspects.

In the power amplifier having the first configuration of the present invention, it is preferable that a starting resistor is connected between the base and the collector of the current reference transistor. Thereby, the time needed for stable operation of circuits can be shortened.

Further, it is preferable that a phase adjusting section capable of adjusting a phase of an input signal is inserted into at least one input side of the operational amplifier. Thereby, an adjustment for limiting the output of the operational amplifier to DC components will be realized.

In the power amplifier having any of the above-described configurations, it is preferable that a feedback resistor is inserted in series between the emitter and the ground of the current reference transistor. Thereby, as the mirror ratio of a current mirror formed of the current reference transistor and the RF operation transistor, a mirror ratio not smaller than the transistor size ratio can be obtained.

Further, it is preferable that an RF blocking resistor or an RF blocking inductor is provided between the output of the voltage-to-current conversion transistor and the RF operation transistor. Thereby, a backflow of an RF signal can be prevented. Furthermore, since the resistors are not inserted into the base in series, a current variation due to the relative variation in $h_{FE}$ between the transistors forming the current mirror can be suppressed.

Further, a low pass filter may be inserted into the input of the operational amplifier.

Further, the emitter of the RF operation transistor may be grounded via an inductor.

By configuring radio equipment that includes a power amplifier having any of the above-described configurations, small and low-cost radio equipment can be realized.

Hereinafter, power amplifiers according to the embodiments of the present invention will be described by way of illustrative embodiments with reference to the drawings.

EMBODIMENT 1

Figure 2:
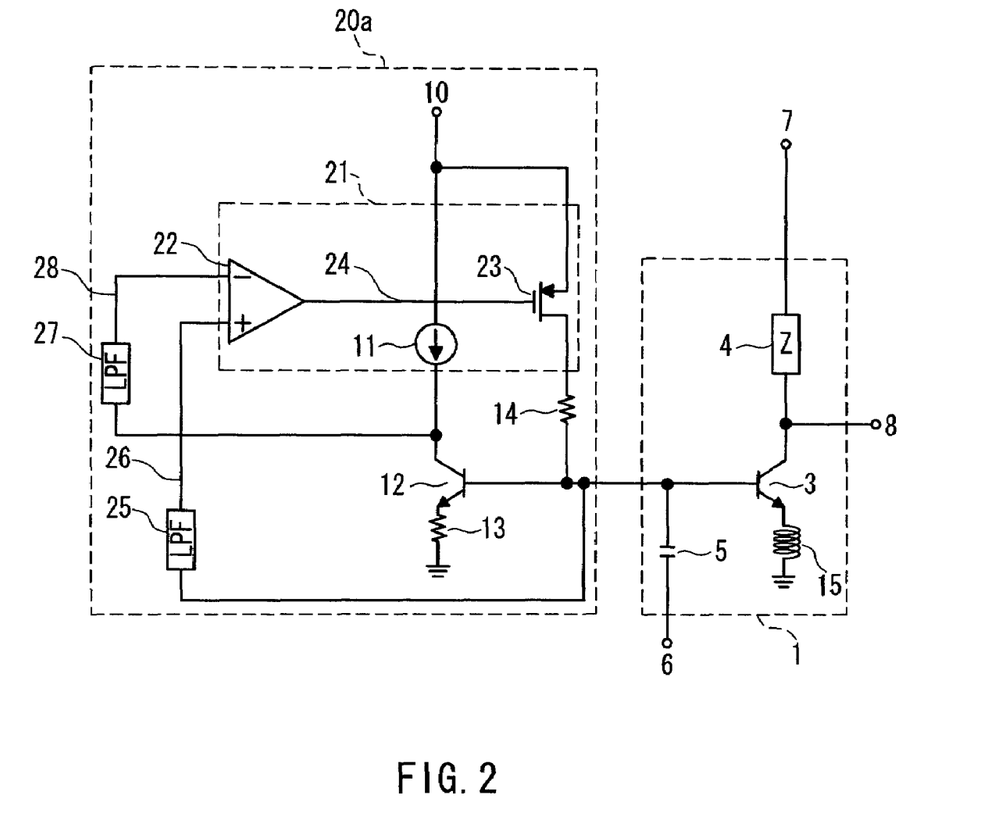
FIG. 2 is a circuit diagram of a power amplifier according to a first embodiment of the present invention.

FIG. 2 is a circuit diagram showing a power amplifier according to a first embodiment of the present invention. This power amplifier includes the RF operation section 1 and a DC bias circuit 20a. Similarly to the RF operation section 1 in the conventional example shown in FIG. 1, the RF operation section 1 includes the RF operation transistor 3, the impedance 4, the DC blocking capacitor 5, and the feedback inductor 15. Accordingly, redundant description will be omitted.

The DC bias circuit 20a has a configuration in which the base current compensation transistor 9 in the DC bias circuit 2 shown in FIG. 1 is replaced by a base current compensation circuit 21. Therefore, the same reference numerals will be assigned to the identical elements, and redundant description will be omitted. The base current compensation circuit 21 includes an operational amplifier 22 formed of CMOS and a voltage-to-current conversion transistor 23. An output 24 of the operational amplifier 22 is supplied to the gate of the voltage-to-current conversion transistor 23. When the voltage-to-current conversion transistor 23 is a P-channel MOS transistor, the source is connected to the power supply 10 and the drain is connected to one end of the RF blocking resistor 14.

The base of the RF operation transistor 3 is connected to the RF blocking resistor 14, the DC blocking capacitor 5, a first LPF (low pass filter) 25, and the base of the current reference transistor 12. The other end of the first LPF 25 is connected to a first input 26 of the operational amplifier 22. The collector of the current reference transistor 12 is connected to one end of a second LPF 27. The other end of the second LPF 27 is connected to a second input 28 of the operational amplifier 22.

Though the voltage-to-current conversion transistor 23 is formed of a P-channel MOS transistor in this embodiment, it is not limited to a P-channel MOS transistor, and a PNP transistor, an NPN transistor, an N-channel MOS transistor, or the like may be used. As the blocking resistor 14, an inductor also can be used in place of the resistance element. The first and the second LPFs 25 and 27 are not necessarily required, because the effect of this embodiment can be obtained even if the LPFs are removed and the remaining lines are short-circuited. Further, though the separate power supplies, i.e., the power supply 10 and the power supply 7, are used, the power supplies are not necessarily provided separately, and a single power supply may be used. Furthermore, the feedback inductor 15 is not necessarily required, because the RF operation transistor 3 may be grounded directly.

Hereinafter, an operation of the power amplifier configured as described above will be described.

The reference current source 11 is formed of the voltage-to-current conversion circuit and the like. The RF operation transistor 3 and the current reference transistor 12 in the RF operation section 3 form a current mirror circuit. A feedback is applied to the operational amplifier 22 so that the voltage of the collector and that of the base of the current reference circuit 12 have the same electric potential. The base current compensation circuit 21 compensates a reference current. The RF blocking resistor 14 blocks an inflow of a high frequency signal to the voltage-to-current conversion transistor 23 in the base current compensation circuit 21.

Though a high frequency current flows into the current reference transistor 12, the linearity of input and output can be enhanced by increasing the resistance value of the feedback resistor 13 sufficiently. Further, by inserting the feedback resistor 13, the mirror ratio of the current mirror will not be determined solely on the transistor size ratio but also on a thermal voltage, the resistance value of the feedback resistor 13, and the current value of the reference current source 11. Therefore, a mirror ratio not smaller than a transistor size ratio can be obtained.

When the resistance value of the feedback resistor 13 is R1, and respective emitter areas of the RF operation transistor 3 and the current reference transistor 12 are Q1 and Q2 respectively, and currents that flow at the collector ends of respective transistors 3 and 12 are I1, I2 respectively, it is preferable that the circuit is configured to satisfy the following formula:

$$I2 = Vt/R1 \times \ln((Q2/Q1) \times (I1/I2)).$$

Here, Vt denotes a thermal voltage. With this configuration, the power amplifier will be optimized to be driven with a further improved low power supply voltage, while inheriting the basic functions of a conventional circuit.

Figure 3:
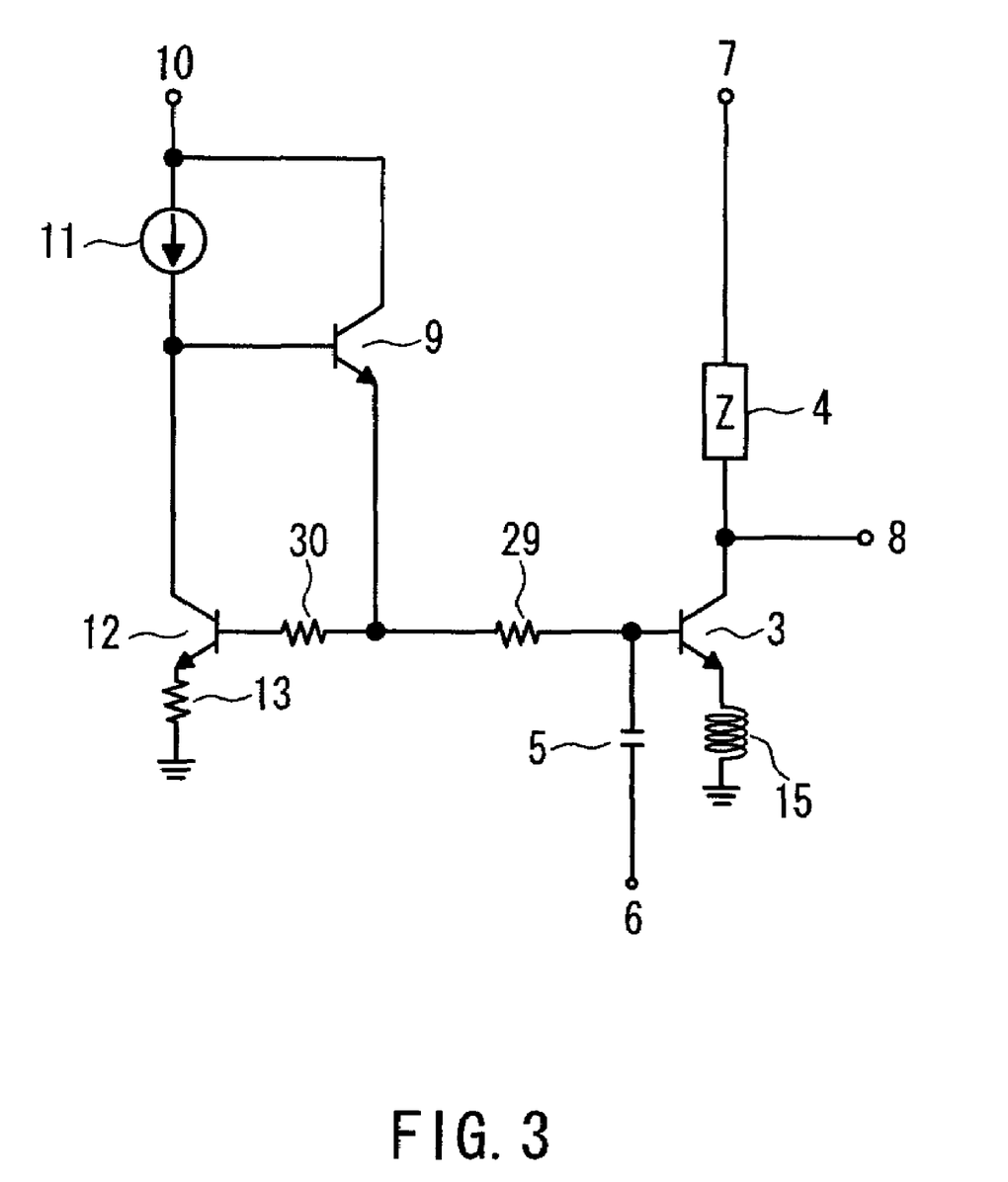
FIG. 3 is a circuit diagram of a power amplifier in which relative variation in $h_{FE}$ occurs.

On the other hand, as shown in FIG. 3, in a conventional configuration, when an RF blocking resistor 29 and a bias resistor 30 with a resistance ratio inversive to the current ratio are inserted into the bases of RF operation transistor 3 and the current reference transistor 12 that form the current mirror, a current variation due to the relative variation in $h_{FE}$ occurs. On the contrary, since a difference in voltage drop due to serial resistors does not arise in the configuration of this embodiment, a current variation due to the relative variation in $h_{FE}$ can be prevented.

A P-channel MOS transistor is used as the voltage-to-current conversion transistor 23 in this embodiment. The reason for this is that P-channel MOS transistors are operable even when a voltage to be inputted to their gates is 0 V, and thereby advantageous to operate the amplifier with a low power supply voltage.

Figure 4:
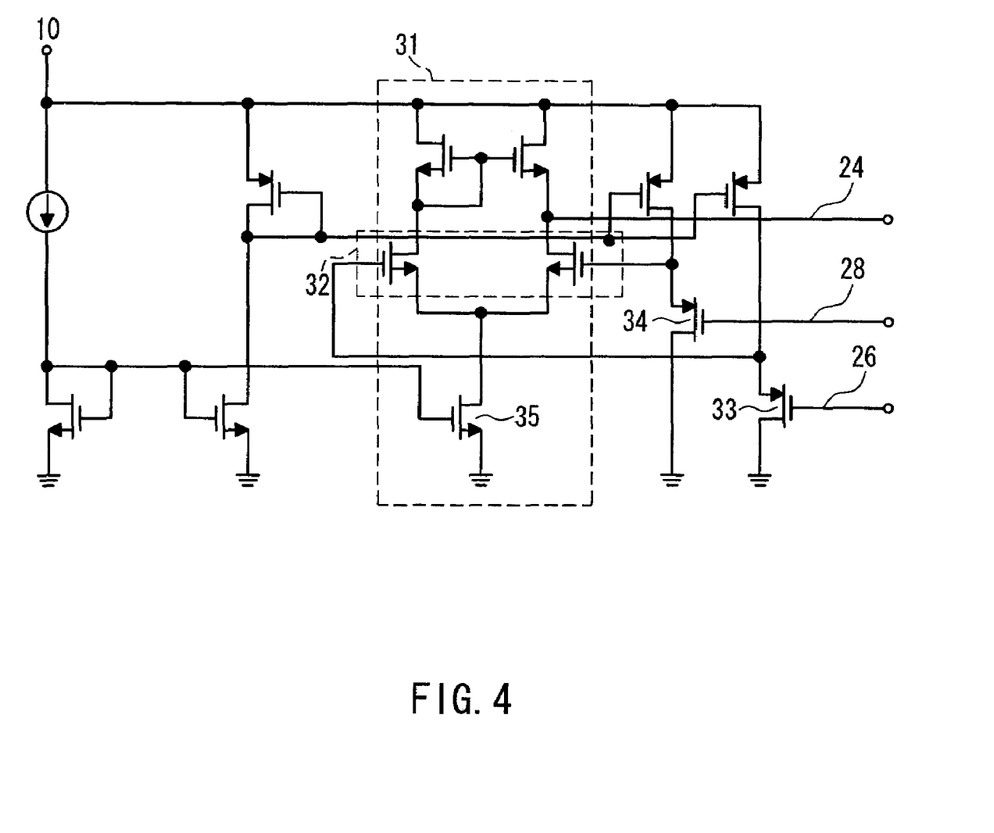
FIG. 4 is a circuit diagram of an N-channel MOS transistor-type operational amplifier according to the present invention.

The voltage between the first input 26 and the second input 28 of the operational amplifier 22 in this embodiment corresponds to a base-emitter voltage Vbe of the current reference transistor 12. Here, the circuit diagram of FIG. 4 shows a case in which the operational amplifier 22 is formed of an N-channel MOS transistor. In this configuration, it is necessary to widen the gates of an amplification transistor 32 forming a differential amplifier 31, or to insert level shift transistors 33, 34 formed of P-channel MOS transistors between the first input 26 and the gate of the amplification transistor 32, and between the second input 28 and the gate of the amplification transistor 32.

The reason for this is that when the input of the operational amplifier 22 is Vbe, a gate-source voltage Vgs for feeding a bias current of the differential amplifier 31 to a bias transistor 35 runs short. By widening the gate of the amplification circuit 32 in order to lower Vgs of the amplification transistor 32, or by inserting the level shift transistors 34 and 33, a source-drain voltage Vds enabling a sufficient bias current to be fed to the differential amplifier 31 can be secured.

Figure 5:
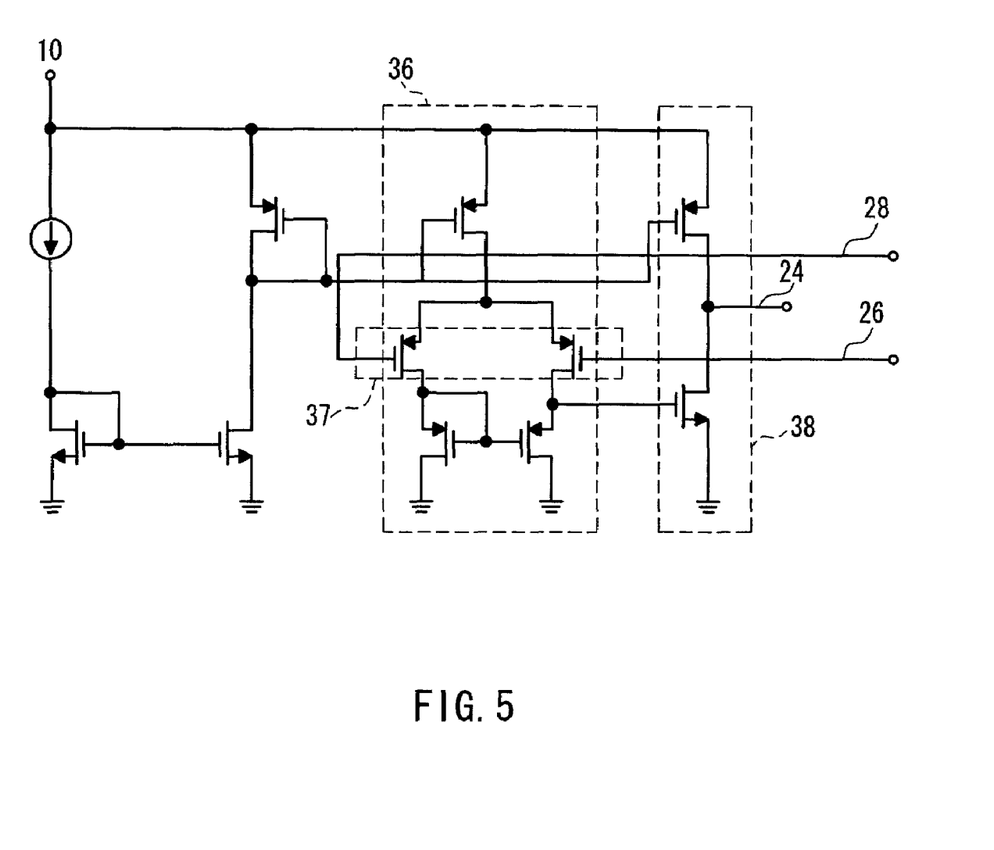
FIG. 5 is a circuit diagram of a P-channel MOS transistor-type operational amplifier according to the present invention.

FIG. 5 shows a case in which the operational amplifier 22 is formed of a P-channel MOS transistor. In this circuit, the first input 26 and the second input 28 of the operational amplifier 22 are inputted directly to the gate of the amplification transistor 37 forming the differential amplifier 36. The output of the differential amplifier 36 is connected to a source grounded circuit 38, and becomes an output 24 of the operational amplifier 22. Thus, when forming the operational amplifier of a P-channel MOS transistor, the circuit can be made simple.

As described above, according to this embodiment, the circuit can be used at a low power supply voltage, while maintaining the advantages of a conventional circuit.

EMBODIMENT 2

Figure 6:
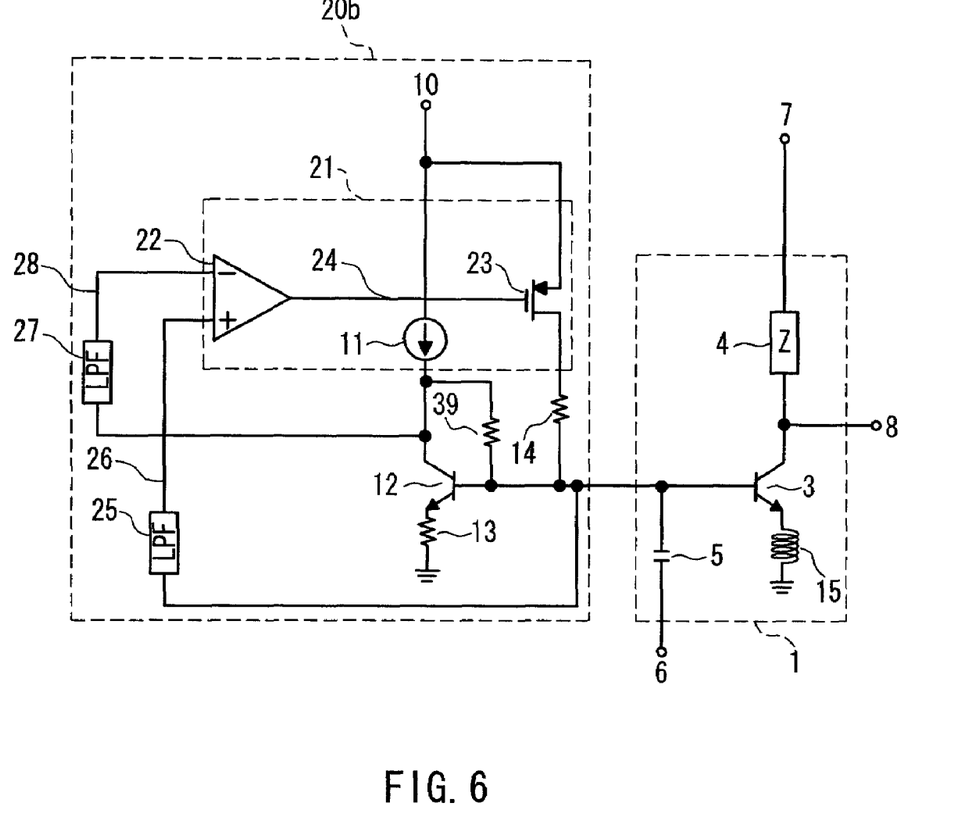
FIG. 6 is a circuit diagram of a power amplifier according to a second embodiment of the present invention.

FIG. 6 is a circuit diagram showing a power amplifier according to a second embodiment of the present invention. In FIG. 6, the same reference numerals will be assigned to like elements in the circuit according to the first embodiment shown in FIG. 2, and redundant description will be omitted.

In this embodiment, a DC bias circuit 20b has a configuration in which a starting resistor 39 is inserted between the collector and the base of the current reference transistor 12 in the circuit according to the first embodiment. Hereinafter, an operation of this power amplifier will be described.

In a case where the starting resistor 39 is not provided, the base potential of the current reference transistor 12 is substantially 0 V when the power source is turned on. Therefore, it will take more time for equalizing the collector potential and the base potential of the current reference transistor 12 based on a feedback from the operational amplifier 22. On the contrary, the difference between the base potential and the collector potential of the current reference transistor 12 at the time of turning the power source on can be reduced by inserting the starting resistor 29, thereby making it possible to shorten the time needed for a stable operation. Since there is substantially no potential difference between the emitter and the base of the current reference transistor 12 in the stable operation mode, a current hardly flows into the starting resistor 39.

Since operations of other sections are identical to those in the first embodiment, redundant description will be omitted.

As described above, according to this embodiment, a starting current can be fed to the base of the current reference transistor 12 from the starting resistor 39 only when the power source is turned on. Thereby, the time needed for a stable operation of the amplifier can be shortened.

EMBODIMENT 3

Figure 7:
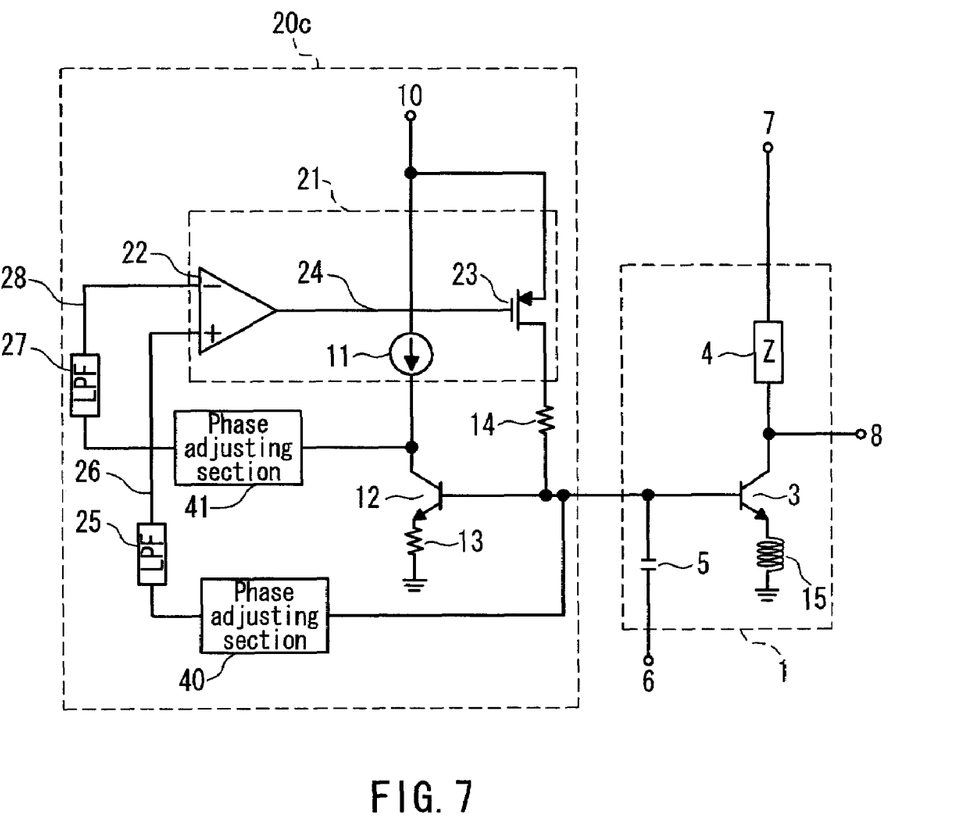
FIG. 7 is a circuit diagram of a power amplifier according to a third embodiment of the present invention.

FIG. 7 is a circuit diagram showing a power amplifier according to a third embodiment of the present invention. In FIG. 7, the same reference numerals will be assigned to like elements in the circuit according to the first embodiment shown in FIG. 2, and redundant description will be omitted.

In this embodiment, a DC bias circuit 20c has a configuration in which a phase adjusting section 40 is inserted between the first input 26 of the operational amplifier 22 and the base of the current reference transistor 12 in the circuit according to the first embodiment, and a phase adjusting section 41 is inserted between the second input 28 of the operational amplifier 22 and the collector of the current reference transistor 12. It is not necessarily required to provide the phase adjusting sections 40, 41 to both the first input 26 and the second input 28, and the phase adjusting section may be inserted into either one of the inputs. Hereinafter, an operation of this power amplifier will be explained.

The phase adjusting sections are set to adjust signals inputted to the first input 26 and to the second input 28 of the operational amplifier 22 so that the signals have the same phase. By inputting signals having the same phase, phase components are canceled at the amplification transistors 32 shown in FIG. 4 or at the amplification transistors 37 shown in FIG. 5, and only DC components that do not contain AC components are outputted as the output 24 of the operational amplifier 22. Since the output 24 of the operational amplifier 22 does not contain any AC components, only a DC component current will be supplied from the base current compensation circuit 21, thereby enhancing the linearity of operation of the RF operation transistor 3.

The phase adjusting sections 40, 41 can be provided as a circuit for a phase adjustment. They also can be provided by adjusting respective wiring lengths of the inputs of the operational amplifier 22. The adjustment of phases can be made in a manufacturing process, while observing signals outputted from the RF signal output terminal.

Operations of other sections are identical to those in the first embodiment.

As described above, according to this embodiment, DC components can be outputted as the output 24 of the operational amplifier, thereby enabling to configure an amplifier with high linearity.

EMBODIMENT 4

Figure 8:
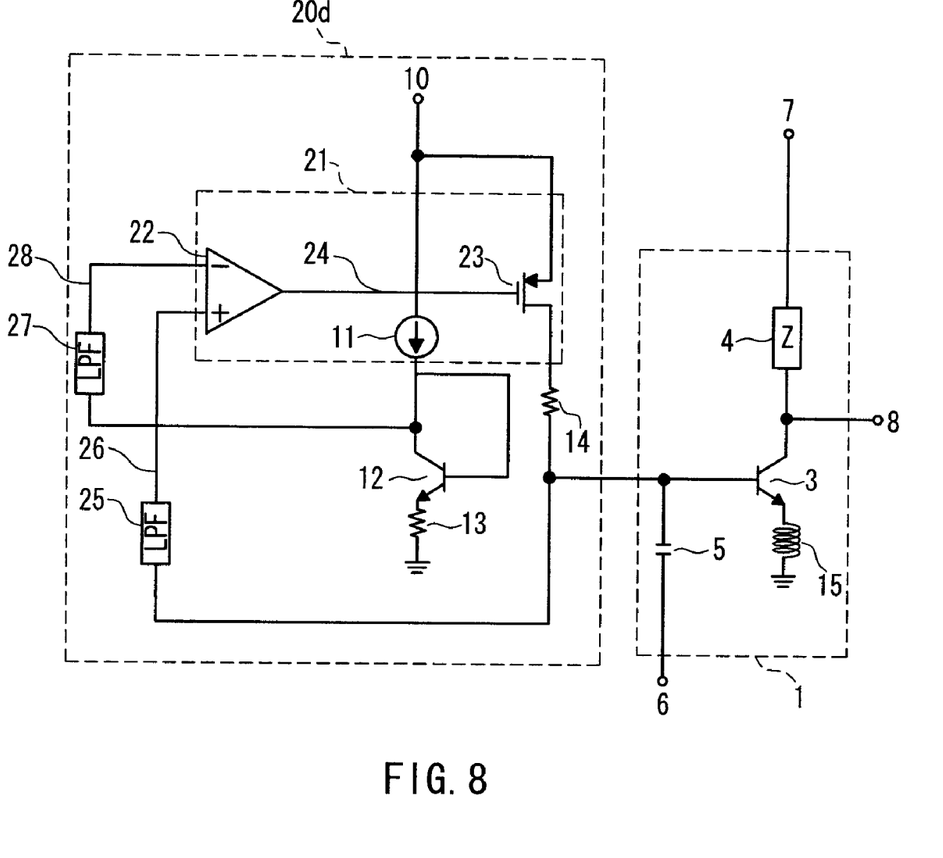
FIG. 8 is a circuit diagram of a power amplifier according to a fourth embodiment of the present invention.

FIG. 8 is a circuit diagram showing a power amplifier according to a forth embodiment of the present invention. In FIG. 8, the same reference numerals will be assigned to like elements in the circuit according to the first embodiment shown in FIG. 2, and redundant description will be omitted.

In this embodiment, a DC bias circuit 20d is configured not by directly coupling the base of the current reference transistor 12 and the base of the RF transistor 3 of the circuit according to the first embodiment but by short-circuiting the base and the collector of the current reference transistor 12 to connect to a diode. A current is supplied from the voltage-tocurrent conversion transistor 23 to the base of the RF operation transistor 3. Hereinafter, an operation of this power amplifier will be described.

Since the bases of the current reference transistor 12 and the RF operation transistor 3 are not coupled directly, a high frequency signal inputted from the RF signal input terminal 6 is prevented from flowing into the current reference transistor 12. Thereby, deterioration in linearity due to a backflow of a high frequency signal can be prevented.

Operations of other sections such as the RF operation section 1, the base current compensation circuit 21, and the like are identical to those in the first embodiment.

As described above, according to this embodiment, since the bases of the current reference transistor 12 and the RF transistor 3 are not coupled directly, a high frequency signal is prevented from flowing into the reference current source. Thereby, an amplifier with high linearity can be configured.

According to the power amplifier of the present invention, it is possible to achieve a less power consumption and a smaller chip area, and it is possible to prevent a current variation due to the relative variation in $h_{FE}$, so as to be driven with a low power supply voltage. The power amplifier of the present invention is mainly useful for various kinds of radio equipment, communication equipment, measuring devices, and the like.

The invention may be embodied in other forms without departing from the sprit of essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is

1. A power amplifier comprising:
an RF operation transistor having a base to which an RF signal is inputted, an emitter connected to the ground, and a collector connected to a power supply and a terminal for outputting an RF signal;
a current reference transistor having a collector connected to a reference current source, an emitter connected to the ground, and a base connected to the base of the RF operation transistor;
a starting resistor connected between the base and the collector of the current reference transistor;
an operational amplifier formed of CMOS having one input connected to the collector of the current reference transistor and the other input connected to the base of the RF operation transistor; and
a voltage-to-current conversion transistor for converting an output of the operational amplifier to a current, the current being supplied to the base of the RF operation transistor.

2. The power amplifier according to claim 1, wherein the operational amplifier is formed by using a P-channel MOS transistor.

3. The power amplifier according to claim 1, wherein a feedback resistor is inserted in series between the emitter and ground of the current reference transistor.

4. The power amplifier according to claim 1, wherein an RF blocking resistor or an RF blocking inductor is provided between an output of the voltage-to-current conversion transistor and the RF operation transistor.

5. The power amplifier according to claim 1, wherein a low pass filter is inserted into an input of the operational amplifier.

6. The power amplifier according to claim 1, wherein the emitter of the RF operation transistor is grounded via an inductor.

7. Radio equipment comprising the power amplifier according to claim 1.

8. A power amplifier comprising:
an RF operation transistor having a base to which an RF signal is inputted, an emitter connected to the ground, and a collector connected to a power supply and a terminal for outputting an RF signal;
a current reference transistor having a collector connected to a reference current source, an emitter connected to the ground, and a base connected to the base of the RF operation transistor;
an operational amplifier formed of CMOS having one input connected to the collector of the current reference transistor and the other input connected to the base of the RF operation transistor;
a phase adjusting section capable of adjusting a phase of an input signal and inserted into at least one input side of the operational amplifier; and
a voltage-to-current conversion transistor for converting an output of the operational amplifier to a current, the current being supplied to the base of the RF operation transistor.

9. Radio equipment comprising the power amplifier according to claim 8.

10. The power amplifier according to claim 8, wherein the operational amplifier is formed by using a P-channel MOS transistor.

11. The power amplifier according to claim 8, wherein a feedback resistor is inserted in series between the emitter and ground of the current reference transistor.

12. The power amplifier according to claim 8, wherein an RF blocking resistor or an RF blocking inductor is provided between an output of the voltage-to-current conversion transistor and the RF operation transistor.

13. The power amplifier according to claim 8, wherein a low pass filter is inserted into an input of the operational amplifier.

14. The power amplifier according to claim 8, wherein the emitter of the RF operation transistor is grounded via an inductor.

* * * * *